United States Patent
Nakagawa et al.

(10) Patent No.: US 9,499,411 B2
(45) Date of Patent: Nov. 22, 2016

(54) DEVICE FOR PRODUCING AND METHOD FOR PRODUCING DODECACARBONYL TRIRUTHENIUM

(71) Applicant: Tanaka Kikinzoku Kogyo K.K., Chiyoda-ku, Tokyo (JP)

(72) Inventors: Hirofumi Nakagawa, Tsukuba (JP); Tasuku Ishizaka, Tsukuba (JP); Hirofumi Ishida, Tsukuba (JP); Ken Hagiwara, Tsukuba (JP); Akiko Kumakura, Tsukuba (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 15/030,084

(22) PCT Filed: Oct. 14, 2014

(86) PCT No.: PCT/JP2014/077322
§ 371 (c)(1),
(2) Date: Apr. 18, 2016

(87) PCT Pub. No.: WO2015/064353
PCT Pub. Date: May 7, 2015

(65) Prior Publication Data
US 2016/0251232 A1    Sep. 1, 2016

(30) Foreign Application Priority Data
Oct. 29, 2013 (JP) .................................. 2013-224211

(51) Int. Cl.
C01G 55/00 (2006.01)
B01D 7/00 (2006.01)
C23C 16/16 (2006.01)

(52) U.S. Cl.
CPC .............. *C01G 55/008* (2013.01); *B01D 7/00* (2013.01); *C23C 16/16* (2013.01); *C01P 2006/80* (2013.01)

(58) Field of Classification Search
CPC ........ C01G 55/008; B01D 7/00; C23C 16/16
USPC ................. 556/136; 423/417; 96/373, 378
See application file for complete search history.

(56) References Cited

U.S. PATENT DOCUMENTS

| | | |
|---|---|---|
| 2007/0072401 A1 | 3/2007 | Suzuki |
| 2007/0231241 A1 | 10/2007 | Suzuki |
| 2014/0057050 A1* | 2/2014 | Saito ...................... C23C 16/30 427/252 |
| 2015/0344510 A1* | 12/2015 | Saito ...................... C23C 16/16 556/136 |

FOREIGN PATENT DOCUMENTS

| | | |
|---|---|---|
| JP | 2008-520835 A | 6/2008 |
| JP | 2008-244298 A | 10/2008 |
| JP | 2013-036054 A | 2/2013 |

OTHER PUBLICATIONS

International Search Report PCT/JP2014/077322.

* cited by examiner

*Primary Examiner* — Porfirio Nazario Gonzalez
(74) *Attorney, Agent, or Firm* — Orrick Herrington & Sutcliffe, LLP

(57) ABSTRACT

The present invention provides a method for producing DCR that can efficiently sublimate a large amount of crude DCR to stably supply DCR. Also, the present invention relates to a sublimation apparatus applicable to the production method. The method for producing an organoruthenium compound for a chemical vapor deposition raw material containing dodecacarbonyl triruthenium (DCR) includes the step for purifying DCR by separating impurity elements from crude DCR by a sublimation method, and in the purification step, crude DCR is heated and sublimated in an atmosphere having a carbon monoxide concentration of 30 to 100% and then cooled to precipitate DCR. According to the present invention, a large amount of crude DCR can be efficiently sublimated, and thus a large amount of DCR can be supplied stably.

8 Claims, 2 Drawing Sheets

CO CONCENTRATION 70%

CO CONCENTRATION 50%

CO CONCENTRATION 30%

CO CONCENTRATION 5%

DEVICE FOR PRODUCING AND METHOD FOR PRODUCING DODECACARBONYL TRIRUTHENIUM

TECHNICAL FIELD

The present invention relates to a method for producing dodecacarbonyl triruthenium useful as a raw material for producing a ruthenium thin film or a ruthenium compound thin film by a chemical vapor deposition method, and an apparatus used for the production method.

BACKGROUND ART

To produce a ruthenium thin film or a ruthenium compound thin film by a chemical deposition method such as a chemical vapor deposition method (CVD method) or an atomic layer deposition method (ALD method), various organoruthenium compounds have been hitherto known as a raw material for a thin film. One of the organoruthenium compounds for which practical application is recently investigated is dodecacarbonyl triruthenium having a following formula (hereinbelow, referred to as DCR).

[Chemical Formula 1]

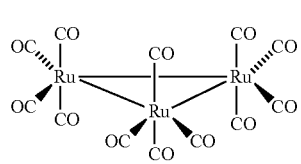

DCR is a substance, which has a melting point of 154 to 155° C. and present as a solid (orange crystal) at normal temperature. DCR has a simple molecular structure, which contains Ru and CO and can be formed into a film only by thermal decomposition without any use of reaction gas. As DCR scarcely leaves an impurity such as a hydrocarbon in a thin film, and although it is a solid raw material, regulation of the specification of the raw material vessel or an appropriate process control does not adversely affect the production efficiency of a thin film, a further application of DCR is expected.

Examples of a method for producing DCR include a method in which a ruthenium compound is carbonylated to obtain crude DCR and the crude DCR is purified to DCR by sublimation, recrystallization, column chromatography, or the like (Patent Document 1). The crude DCR obtained by synthesis of a ruthenium compound contains a trace amount of impurity elements such as iron (Fe), aluminum (Al), and chrome (Cr), and thus purification is necessary after the synthesis, because the impurity elements may cause, at the time of formation of a ruthenium thin film, an ignition phenomenon even when it is contained in a trace amount.

As a purification means for lowering the impurity elements contained in DCR, a sublimation method is effective among the methods described above. That is because, since DCR easily sublimes at reduced pressure, DCR with high purity can be produced by use of a difference in sublimation rate compared to the impurity elements.

RELATED ART DOCUMENT

Patent Documents

Patent Document 1: JP 2013-036054 A

SUMMARY OF THE INVENTION

Problems to be Solved by the Invention

To provide dodecacarbonyl triruthenium (DCR) as a raw material for forming a ruthenium thin film, stable supply of DCR for allowing industrial use of DCR needs to meet the broadening application of ruthenium. However, the production scale cannot be easily increased by a method of a conventional art. Particularly, in the sublimation of crude DCR, although the purification efficiency is good when a small amount of crude DCR like several tens of grams is treated, an increased amount, for example, several kilograms of crude DCR cannot be treated at a time. In a sublimation method of a conventional art, the crude DCR is heated to about 80° C. and sublimated, and when it is attempted to sublimate the crude DCR at such low temperature, it takes a long time and a large amount of crude DCR cannot be homogeneously treated. Meanwhile, when the heating temperature is simply elevated to increase the sublimation efficiency, thermal decomposition of crude DCR occurs, and consequently, the yield of DCR is lowered. As such, a known method for producing DCR is not appropriate for stable sublimation of crude DCR in large amount.

Accordingly, the present invention provides, a method for producing DCR that can efficiently sublimate a large amount of crude DCR to stably supply DCR. The present invention also relates to a sublimation apparatus applicable to that production method.

Means for Solving the Problems

To solve the above problems, the present inventors investigated a method for producing DCR in which a sublimation method is used for purification. That is because, for reducing impurity elements as a raw material suitable for forming a ruthenium thin film, the sublimation method with high resolution power is effective. Accordingly, the present inventors investigated a case in which thermal decomposition of DCR occurs when DCR is purified by the sublimation method.

As a result, the present inventors found that the temperature at which DCR starts to thermally decompose varies depending on the type of atmosphere gas in which DCR is sublimated. Accordingly, the present inventors achieved the present invention which allows, based on selection of atmosphere gas, sublimation at higher heating temperature and treatment of a larger amount of crude DCR than a conventional technique while inhibiting thermal decomposition of DCR.

Namely, the present invention relates to, in a method for producing an organoruthenium compound for a chemical vapor deposition raw material containing dodecacarbonyl triruthenium (DCR) having a following formula, a method for producing DCR in which it has a step for purifying DCR by separating the impurity elements from crude DCR by the sublimation method and, in the purification step, crude DCR is heated and sublimated in an atmosphere having a carbon monoxide concentration of 30 to 100%, after which the resultant is cooled to precipitate DCR.

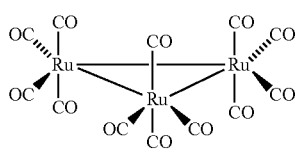

[Chemical Formula 1]

The present invention is characterized in that the crude DCR is sublimated in carbon monoxide (CO) atmosphere. Adoption of carbon monoxide enables a large amount of crude DCR to be sublimated at increased heating temperature while thermal decomposition of DCR is suppressed. Also from the viewpoint of hardly leaving impurities, carbon monoxide is useful for producing DCR as a raw material for chemical vapor deposition. In the present invention, the term "sublimation" only indicates a state change from solid to gas. The change from gas to solid is described as "aggregation."

Hereinbelow, the method for producing DCR in the present invention is explained in detail. In the method of the present invention, the crude DCR as a subject for purification can be obtained by a generally known synthetic method. In a general method for synthesizing DCR, the impurity elements derived from a raw material or materials for constituting a device are incorporated in the obtained DCR. Examples of the impurity elements include iron (Fe), lithium (Li), sodium (Na), magnesium (Mg), aluminum (Al), calcium (Ca), potassium (K), titanium (Ti), vanadium (V), chromium (Cr), manganese (Mn), cobalt (Co), nickel (Ni), copper (Cu), zinc (Zn), strontium (Sr), yttrium (Y), molybdenum (Mo), iridium (Ir), platinum (Pt), gold (Au), lead (Pb), thorium (Th), and uranium (U).

In the present invention, "crude DCR" indicates DCR containing the above impurity elements, specifically, DCR with purity of 90% or higher, preferably, 98% or higher. In view of the purpose of the present invention, i.e., to separate the impurity elements during the purification step, those containing the impurity elements at certain amount or higher is a subject for purification as crude DCR. Thus, DCR with purity of 100% is excluded. In the present invention, crude DCR containing the impurity elements at 5 ppm or more in terms of total elements is preferred as a subject for purification.

To obtain the crude DCR by a synthetic method, a method of carbonylating a ruthenium salt as a raw material can be used. Specifically, a method of directly carbonylating the ruthenium salt with carbon monoxide (hereinbelow, referred to as the direct method) is preferable. Besides the direct method, the synthetic method in which the ruthenium salt is used as the raw material and converted to a ruthenium acetylacetonate intermediate, and the intermediate is carbonylated is known, for example. However, the method going through the intermediate has an increased number of steps, and thus there is a high chance of having impurities. When the crude DCR is synthesized by the direct method, the reaction conditions are preferably as follows: the reaction pressure is 0.2 to 0.9 MPa, the reaction temperature is 50 to 100° C., and the reaction time is 10 to 30 hours.

The ruthenium salt as the raw material for the direct method is preferably ruthenium chloride, ruthenium oxide, ruthenium nitrate, hexaammine ruthenium chloride, or ruthenium acetate, particularly preferably ruthenium chloride. That is because those raw materials are a commercially available material and can be easily obtained. Furthermore, the raw material preferably has high purity. For the synthesis of an organometallic compound such as DCR, an auxiliary metal having a catalytic activity is frequently used. However, in the present invention, addition of the auxiliary metal is not necessary, because the application of such auxiliary metal can contribute to mixing of impurities.

The crude DCR can be obtained by the synthetic method described above. For the method for producing DCR of the present invention, commercially available DCR may be used instead of synthesized DCR.

A purification step for separating the impurity elements is performed for the crude DCR described above. In a conventional purification step, crude DCR is sublimated in an inert gas atmosphere like nitrogen and argon, while in the present invention, it is sublimated in carbon monoxide (CO) atmosphere. The heating temperature for sublimation of crude DCR is about 80° C. in a conventional art. However, by use of carbon monoxide, a treatment with high sublimation efficiency and high yield can be achieved even at heating temperature of 100 to 130° C. without an occurrence of thermal decomposition of DCR. As described above, this is probably because the thermal decomposition temperature of DCR is changed by having a gas atmosphere which is different from a conventional art. When the heating temperature is lower than 100° C., a treatment for long period is required, and when it is higher than 130° C., the sublimation rate increases but thermal decomposition of DCR starts to appear.

In the present invention, inert gas like nitrogen and argon can be also used in combination with carbon monoxide at the time of sublimation of crude DCR in carbon monoxide atmosphere. In that case, the carbon monoxide concentration in the atmosphere gas needs to be in the range of from 30% to 100%. When it is lower than 30%, thermal decomposition of DCR may easily occur when the temperature for subliming DCR is increased, and thus the yield of the purification step cannot be improved.

In the present invention, CO gas is introduced to a reaction vessel at the time of sublimation of crude DCR to have the aforementioned carbon monoxide atmosphere. The supply amount of carbon monoxide (CO) to be introduced is preferably 150 to 1000 sccm, and more preferably 300 to 500 sccm. When it is less than 150 sccm, crude DCR may be thermally decomposed, and when it is more than 1000 sccm, crude DCR may be scattered into a heating vessel to lower the yield. Additionally, the pressure inside the heating vessel during sublimation is preferably 13 to 80 Pa or so, and more preferably 13 to 40 Pa. When it is less than 13 Pa, carbon monoxide will not sufficiently contact with crude DCR, and thus it may undergo thermal decomposition. When it is more than 80 Pa, the sublimation rate tends to decrease, and the longer sublimation time may be needed if the treatment amount of crude DCR is high. Because there is a relationship among the heating temperature, supply amount of carbon monoxide, and pressure inside the heating vessel, when any one of those three setting values is changed, a preferred range of other setting values tends to also change. Accordingly, as for the aforementioned temperature, CO supply amount, and pressure, a preferred value for a case in which other two setting values are already within a preferred range is described.

CO gas is preferably supplied to be evenly dispersed and contact crude DCR. That is because, if carbon monoxide unevenly supplied, thermal decomposition of DCR occurs partially, and consequently, the sublimation efficiency is impaired. Thus, sublimation of crude DCR is preferably performed by supply of, through a sintered filter with filtering accuracy of 5 to 30 μm, CO gas to crude DCR.

Specifically, a method in which CO gas is supplied from the bottom of a sintered filter to crude DCR, which is disposed above the sintered filter, can be adopted. As CO gas is evenly dispersed through pores of the sintered filter, CO gas can be evenly brought into contact with crude DCR. The aforementioned filtering accuracy is a nominal value.

In the purification step of the present invention, crude DCR is sublimated by the above order, vaporized DCR is cooled and precipitated, and DCR with reduced impurity elements is collected. Temperature for cooling DCR is preferably 20° C. or lower.

DCR obtained after the sublimation of crude DCR followed by precipitation may be further subjected to a purification treatment like recrystallization and column chromatography. For example, when a recrystallization treatment is performed after the purification step of the present invention, organic matters like a reactant not used for the synthesis or the like can be separated in addition to the impurity elements.

DCR obtained by the production method of the present invention described above is used, as the raw material for chemical vapor deposition, for producing the ruthenium thin film or the ruthenium compound thin film. The conditions for formation of the ruthenium thin film by use of DCR of the present invention is preferably the film forming temperature of 40 to 150° C. and the film forming pressure of 0.01 to 26.66 Pa. For the chemical vapor deposition, to suppress decomposition of vaporized DCR before forming of a thin film, carbon monoxide (CO) gas can be used. When CO gas is used, the flow rate is preferably 0.1 to 1000 sccm.

In the method for producing DCR described above, it is necessary to evenly contact the crude DCR with carbon monoxide gas during sublimation to evenly proceed with sublimation of crude DCR described above. Thus, in the present invention, a sublimation apparatus equipped with a loading means for loading crude DCR, a CO gas supply means for supplying carbon monoxide to crude DCR, a heating and vaporizing part having a means for heating the loading means, a DCR precipitating part which is connected to the heating and vaporizing part and has a cooler, and a pressure regulating means for suctioning gas inside the heating and vaporizing part and the cooling and precipitating part, in which a sintered filter with filtering accuracy of 5 to 30 μm (nominal value) is installed at the loading means of the heating and vaporizing part, can be used.

As the loading means for crude DCR, a stainless plate with a honeycomb structure or a fishnet structure is used. However, when CO gas is supplied to crude DCR only by the loading means, there was a case in which part of DCR is thermally decomposed if sublimation is carried out at high temperature. This is probably because CO gas is not evenly contact the crude DCR.

Accordingly, in the sublimation apparatus of the present invention, a sintered filter is disposed on the loading means, and thus CO gas can be evenly and widely distributed over crude DCR by the sintered filter. The sintered filter is composed of a sintered material like stainless steel, Ti, Al, ceramic, or the like, and the filtering accuracy (nominal value) is preferably 5 to 30 μm, more preferably 5 to 15 μm, and even more preferably 5 to 10 μm. Furthermore, the cross-sectional thickness is preferably 1 to 3 mm. The loading means can be a groove or the like into to which the sintered filter can be inserted, and does not necessarily require a plate-like loading table like a honeycomb. Namely, a device in which crude DCR is loaded on a filter by the use of the sintered filter only as the loading plate can be used without the use of a plate like a honeycomb.

Furthermore, the heating and vaporizing part is preferably further equipped with a trap filter to prevent incorporation of the impurity elements to a cooling and precipitating part, to prevent infiltration of the impurity elements scattered in a heating vessel into a DCR precipitating part and incorporation of the elements into a product as caused by feed stream of CO gas. The trap filter can be installed at downstream of the crude DCR, and more than one filter can be installed. For the material, a filter containing stainless steel, Ti, Al, ceramic, or the like with shape like fin, net, and honeycomb can be used.

The heating and vaporizing part has a means for heating the loading means. Specifically, a stainless heater, a polyimide heater, a silicone rubber heater, a flexible heater, or the like can be used. A heating means for heating periphery of the heating vessel (referred to as a heating means for periphery) is preferably provided, besides the means for heating the loading means to which DCR is loaded (referred to as a heating means for lower part). The temperature for those two kinds of a heating means is separately set to equalize heating temperature for sublimation of crude DCR. Specifically, when the lower part is set at higher temperature than the periphery, uneven heating temperature during treatment of a large amount of crude DCR can be reduced.

Advantageous Effects of the Invention

In the method for producing DCR, a large amount of crude DCR can be efficiently sublimated to stably supply a large amount of crude DCR. Furthermore, by a sublimation apparatus of the present invention, CO gas is evenly supplied to increase the sublimation efficiency for producing DCR.

DESCRIPTION OF EMBODIMENTS

Hereinbelow, explanations are given for the best embodiment of the present invention.

First, crude crystals of DCR as a sublimation subject were obtained by the following steps. 158 g of ruthenium chloride (manufactured by Tanaka Kikinzoku Kogyo K.K., ruthenium content: 38.67%, chloride content: 47.4 wt %) and 6000 ml of 1-propanol were admixed and stirred with each other, and then added to a 10 L capacity autoclave (made of steel) as a reaction vessel. 269 g of trimethylamine was added to the reaction vessel, and carbon monoxide was additionally added to 0.35 MPa followed by sealing. While carbon monoxide was supplied and this reaction pressure was maintained, the reaction temperature was increased to 85° C. for allowing the DCR synthesis reaction to progress. The reaction was allowed to occur for 17 hours while the solution is being stirred. After the synthesis reaction, the reaction solution was cooled and filtered and the filtrate was collected to obtain 116 g of the crude crystals of DCR with orange color. Yield of the crude crystals of DCR was found to be 99%.

Figure 1:
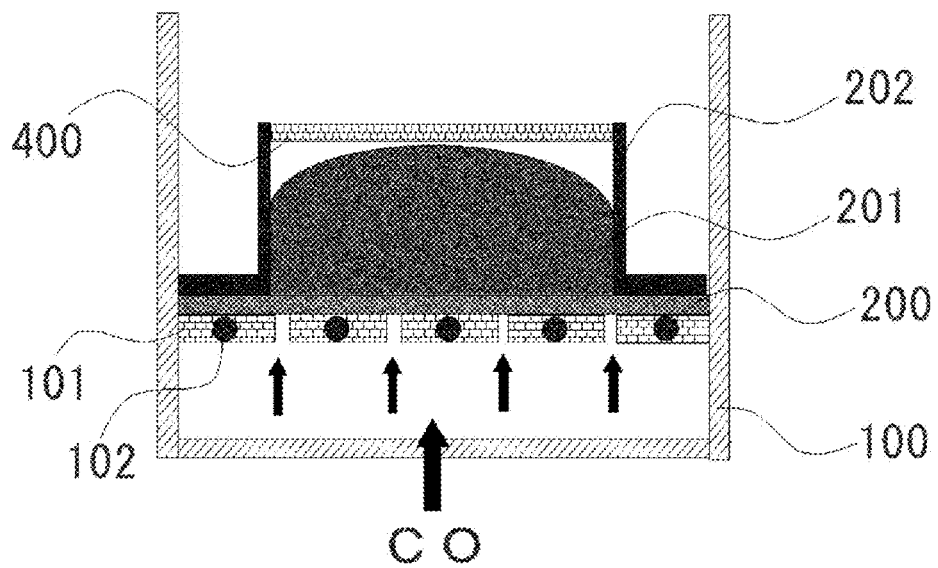
FIG. 1 is a schematic cross-sectional view illustrating a heating vessel of an embodiment.
Figure 2:
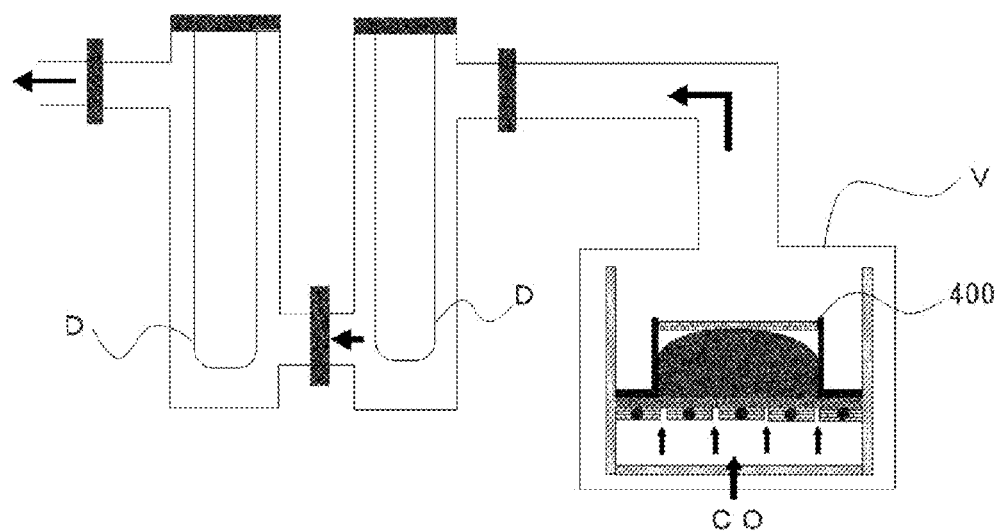
FIG. 2 is a schematic cross-sectional view illustrating a sublimation apparatus of an embodiment.

For purification of the above crude crystals, a sublimation apparatus shown in FIG. 1 and FIG. 2 was used. The sublimation apparatus was equipped with a stainless-steel loading plate 101 (honeycomb, fishnet structure) having a heater 102, which was installed inside a heating vessel 100 equipped with a heater (not illustrated) on its periphery, and a cylindrical inner vessel 202 having a sintered filter 200 (filtering accuracy (nominal value): 10 μm, and cross-sectional thickness: 3 mm) and a flange-shape foot part was provided on top of the loading plate and crude DCR 201 was placed within the inner vessel. At the downstream side of crude DCR, a trap filter 400 (made of SUS, Ti, and structure of fin, net, or honeycomb) was installed. Each of the heaters on the periphery of the heating vessel and inside the loading plate can be set with different heating temperature. The heating vessel 100 was connected to the DCR precipitating part D with a cooler and provided with a pump (not illustrated) for suctioning gas present inside the heating and vaporizing part V.

Before a sublimation test of crude DCR by use of the above sublimation apparatus, a preliminary test was performed to determine the effect of a change in CO concentration in gas on the sublimation efficiency, while mixture gas of CO gas and $N_2$ gas is used as feed gas during sublimation and a small amount of crude DCR is employed as a subject for sublimation. In the test, to have the CO gas concentration shown in Table 1, the mixing ratio between CO gas and $N_2$ gas in the gas for feeding was changed from 30:70 to 95:5. Other conditions for sublimation were as follows: crude crystals of DCR for sublimation were 5 g, the flow rate of CO/$N_2$ mixture gas was 50 sccm, and the heating temperature was 105° C. CHN element analysis was performed for the DCR after sublimation and also the residual amount in the sublimation vessel was measured.

TABLE 1

| CO concentration | CHN element analysis | Residual amount after sublimation |
|---|---|---|
| 70% | Not measured | 0% |
| 50% | Not measured | 0% |
| 30% | H: 0%<br>C: 22.51%<br>N: 0% | 0% |
| 5% | H: 0%<br>C: 22.42%<br>N: 0% | 0.01% |

Figure 3:
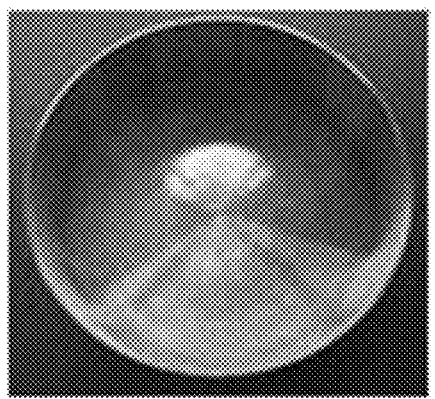
FIG. 3 is a photographic image showing a residual amount observed after sublimation in accordance with CO gas concentration in an embodiment.
Figure 3:
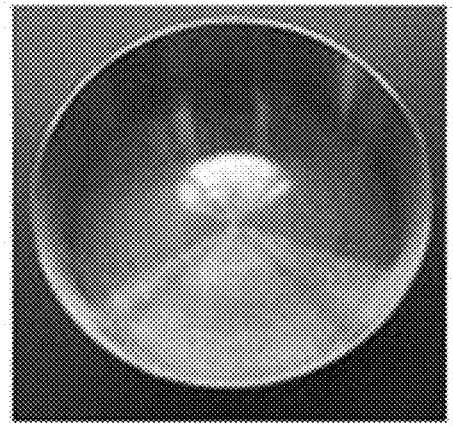
Figure 3:
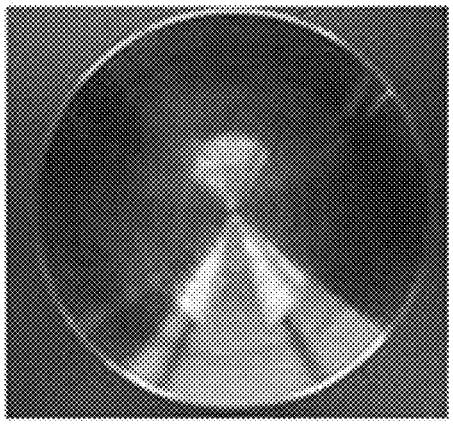
Figure 3:
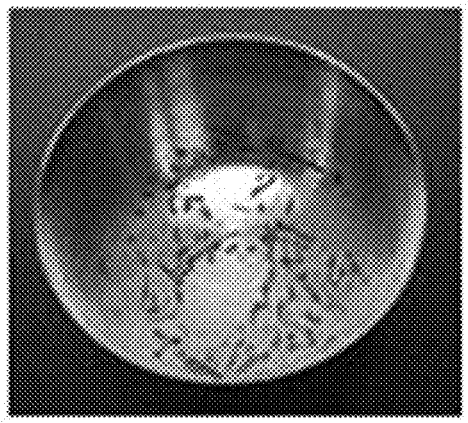

As can be seen from Table 1, when CO concentration in the gas supplied during sublimation was 5 to 70%, the result of CHN analysis of the DCR after the sublimation was good. However, partially metallized residuals were observed in the sublimation vessel at CO concentration of 5% (FIG. 3). Thus, it is assumed that the CO concentration in the feed gas is preferably 30% or higher.

First Embodiment

On a sintered filter of the above sublimation apparatus, crude crystals of DCR was placed (1.5 kg), and sublimation was performed under the following conditions: feed gas flow rate of 500 sccm, heating temperature of 100° C., and vacuum level of 26.6 Pa. After that, DCR was precipitated at cooling water temperature of 5° C. (Test No. 1-4). In this embodiment, the feed gas contained CO only (CO concentration: 100%). Furthermore, for each Example and Comparative Example having the CO gas flow rate, heating temperature, and sublimation time shown in Table 2, sublimation was similarly performed.

TABLE 2

| Test No. | Amount of crude DCR (g) | CO flow rate (sccm) | Heating temperature (° C.) | Pressure (Pa) | Sublimation Time (h) | Yield (%) | Sublimation rate (g/h) |
|---|---|---|---|---|---|---|---|
| 1-1 | 130 | None | 80 | 26.6 | 95 | 77 | 1.5 |
| 1-2 | 1500 | | 115 | | 18.5 | 8 | 7 |
| 1-3 | | | | | | —* | —* |
| 1-4 | 1500 | 500 | 100 | | | 76 | 62 |
| 1-5 | | | 125 | | | 64 | 87 |
| 1-6 | | | 115 | 13.3 | | 63 | 93 |
| 1-7 | | | 118 | 80.0 | | 21 | 17 |
| 1-8 | | 300 | 118 | 26.6 | | 50 | 45 |
| 1-9 | | 1000 | 118 | 26.6 | | 70 | 90 |

*DCR was blackened after sublimation and could not be retrieved in Test No. 1-3.

When CO was supplied during the sublimation, the sublimation rate was so high that DCR was obtained with high yield even when the treatment amount of crude DCR was great (1500 g) (Test Nos. 1-4 to 1-9). Meanwhile, when the amount of crude DCR was small (130 g), DCR can be obtained with high yield even without supply of CO gas. However, due to the low sublimation rate, it took a long time before the desired yield was obtained (Test No. 1-1). Furthermore, when a large amount (1500 g) of crude DCR was sublimated without supply of CO gas, DCR yield was low in sublimation for a short time (18.5 h), when the heating temperature was low (80° C.) (Test No. 1-2). When the heating temperature was high (115° C.) (Test No. 1-3), thermal decomposition by which sublimated DCR blackened was observed.

Within the CO flow rate range of from 150 to 1000 sccm, the yield was high as the sublimation rate was high (Test Nos. 1-8 and 1-9). When the pressure was 80.0 Pa (Test No. 1-7), DCR yield was 21%, but the sublimation rate was at least 10 times higher than that of an example of a conventional art (Test No. 1-1). Accordingly, higher DCR yield than a conventional art can be obtained by adjusting the sublimation time.

Measurement of physical properties: Regarding the DCR obtained from above, impurity elements were measured with ICP-MS for the DCR crystals which have been collected in a cooling part after the sublimation step, and the results shown in Table 3 were obtained.

TABLE 3

| Test No. | Fe | Li | Na | Mg | Al | Ca | K | Ti | V |
|---|---|---|---|---|---|---|---|---|---|
| 1-1 | 0.5 | <0.1 | <0.1 | <0.1 | <0.1 | <0.1 | <0.1 | <0.1 | <0.1 |
| 1-4 | 0.3 | <0.1 | <0.1 | <0.1 | <0.1 | <0.1 | <0.1 | <0.1 | <0.1 |

| Test No. | Cr | Mn | Co | Ni | Cu | Zn | Sr | Y | Mo |
|---|---|---|---|---|---|---|---|---|---|
| 1-1 | <0.1 | <0.1 | <0.1 | <0.1 | <0.1 | <0.1 | <0.1 | <0.1 | <0.1 |
| 1-4 | <0.1 | <0.1 | <0.1 | <0.1 | <0.1 | <0.1 | <0.1 | <0.1 | <0.1 |

| Test No. | Ir | Pt | Au | Pb | Th | U |
|---|---|---|---|---|---|---|
| 1-1 | <0.1 | <0.1 | <0.1 | <0.1 | <0.1 | <0.1 |
| 1-4 | <0.1 | <0.1 | <0.1 | <0.1 | <0.1 | <0.1 |

Unit: ppm

From the above results, it was found that DCR (Test No. 1-4) obtained by supply of CO gas during sublimation step had the same high purity as the DCR (Test No. 1-1) obtained by a conventional method in which CO gas was not used (i.e., a method of sublimating a small amount of DCR at low temperature).

Second Embodiment

The results obtained from purification of crude DCR by use of a sublimation apparatus in which thickness of a sintered filter was 3.0 mm (Test No. 2-1) or 1.7 mm (Test No. 2-2) are shown in Table 4. The sublimation conditions were the same as those of Test No. 1-4 of the first embodiment (DCR: 1500 g, CO flow rate: 500 sccm, heating temperature: 100° C., pressure: 26.6 Pa, and sublimation time: 18.5 h). For Test No. 2-2, a measurement of impurity elements based on ICP-MS was also carried out.

TABLE 4

| Test No. | Sintered filter | Time for sublimation | Yield | Sublimation rate |
|---|---|---|---|---|
| 2-1 | 3.0 mm | 18.5 hours | 95 | 125 |
| 2-2 | 1.7 mm | 18.5 hours | 87 | 100 |

As can be seen from Table 4, when the thickness of a sintered filter was 3.0 mm (Test No. 2-1), the sublimation rate was higher than a case in which the thickness was 1.7 mm (Test No. 2-2), and thus DCR was obtained with high yield. This is probably because the film thickness was increased and CO gas was sufficiently diffused and supplied over crude DCR.

TABLE 5

| Test No. | Fe | Li | Na | Mg | Al | Ca | K | Ti | V |
|---|---|---|---|---|---|---|---|---|---|
| 1-1 | 0.5 | <0.1 | <0.1 | <0.1 | <0.1 | <0.1 | <0.1 | <0.1 | <0.1 |
| 2-2 | 0.2 | <0.1 | <0.1 | <0.1 | <0.1 | <0.1 | <0.1 | <0.1 | <0.1 |

| Test No. | Cr | Mn | Co | Ni | Cu | Zn | Sr | Y | Mo |
|---|---|---|---|---|---|---|---|---|---|
| 1-1 | <0.1 | <0.1 | <0.1 | <0.1 | <0.1 | <0.1 | <0.1 | <0.1 | <0.1 |
| 2-2 | <0.1 | <0.1 | <0.1 | <0.1 | <0.1 | <0.1 | <0.1 | <0.1 | <0.1 |

| Test No. | Ir | Pt | Au | Pb | Th | U |
|---|---|---|---|---|---|---|
| 1-1 | <0.1 | <0.1 | <0.1 | <0.1 | <0.1 | <0.1 |
| 2-2 | <0.1 | <0.1 | <0.1 | <0.1 | <0.1 | <0.1 |

Unit: ppm

It was confirmed from Table 5 that, even when the thickness of a sintered filter was modified (Test No. 2-2), DCR with high purity was obtained like the DCR (Test No. 1-1) obtained by a conventional method (i.e., a method of sublimating a small amount of DCR at low temperature).

INDUSTRIAL APPLICABILITY

As explained above, DCR can be produced in a large amount by the present invention. Thus, DCR can be industrially used for a variety of applications and can be stably supplied.

REFERENCE SIGNS LIST

100 Heating vessel
101 Loading plate
102 Heater
200 Sintered filter
201 Crude DCR
202 Inner vessel
400 Trap filter
V Heating and vaporizing part
D DCR precipitating part

The invention claimed is:
1. A method for producing an organoruthenium compound for a chemical vapor deposition raw material containing dodecacarbonyl triruthenium (DCR) represented by a following formula, comprising the step of:

[Chemical Formula 1]

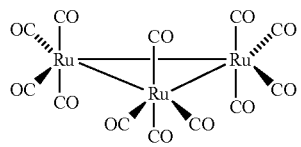

purifying DCR by separating impurity elements from crude DCR by a sublimation method, wherein the purification step further comprising: supplying CO gas from the bottom of a sintered filter with filtering accuracy of 5 to 30 μm to crude DCR which is disposed above the sintered filter; heating and sublimating the crude DCR in an atmosphere having a carbon monoxide concentration of 30 to 100%; and then cooling the crude DCR to precipitate DCR.

2. The method for producing DCR according to claim 1, wherein sublimation of crude DCR is performed by heating at temperature of from 100 to 130° C.

3. The method for producing DCR according to claim 1, wherein sublimation of crude DCR is performed by flowing carbon monoxide at 150 to 1000 sccm.

4. A sublimation apparatus applied for the purification step of the method for producing DCR defined in claim 1, comprising:
- a heating and vaporizing part having a loading means for loading crude DCR, a CO gas supply means for supplying carbon monoxide to crude DCR; and a means for heating the loading means;
- a DCR precipitating part which is connected to the heating and vaporizing part and has a cooler; and
- a pressure regulating means for suctioning gas present inside the heating and vaporizing part and the DCR precipitating part, wherein
- a sintered filter with filtering accuracy of 5 to 30 μm is installed at the loading means of the heating and vaporizing part.

5. The sublimation apparatus according to claim 4, wherein the heating and vaporizing part is further equipped with a trap filter for impurity elements.

6. The method for producing DCR according to claim 2, wherein sublimation of crude DCR is performed by flowing carbon monoxide at 150 to 1000 sccm.

7. A sublimation apparatus applied for the purification step of the method for producing DCR defined in claim 2, comprising:
- a heating and vaporizing part having a loading means for loading crude DCR, a CO gas supply means for supplying carbon monoxide to crude DCR; and a means for heating the loading means;
- a DCR precipitating part which is connected to the heating and vaporizing part and has a cooler; and
- a pressure regulating means for suctioning gas present inside the heating and vaporizing part and the DCR precipitating part, wherein
- a sintered filter with filtering accuracy of 5 to 30 μm is installed at the loading means of the heating and vaporizing part.

8. A sublimation apparatus applied for the purification step of the method for producing DCR defined in claim 3, comprising:
- a heating and vaporizing part having a loading means for loading crude DCR, a CO gas supply means for supplying carbon monoxide to crude DCR; and a means for heating the loading means;
- a DCR precipitating part which is connected to the heating and vaporizing part and has a cooler; and
- a pressure regulating means for suctioning gas present inside the heating and vaporizing part and the DCR precipitating part, wherein a sintered filter with filtering accuracy of 5 to 30 μm is installed at the loading means of the heating and vaporizing part.

* * * * *